(12) United States Patent
Ha et al.

(10) Patent No.: US 11,574,962 B2
(45) Date of Patent: Feb. 7, 2023

(54) DISPLAY PANEL INCLUDING A LIGHT CONTROL LAYER AND A CAPPING LAYER

(71) Applicant: Samsung Display Co., Ltd., Yongin-si (KR)

(72) Inventors: Jaeheung Ha, Suwon-si (KR); Wonjong Kim, Suwon-si (KR); Yisu Kim, Seoul (KR); Jongwoo Kim, Hwaseong-si (KR); Changyeong Song, Suwon-si (KR); Jaejin Lyu, Yongin-si (KR); Woosuk Jung, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 163 days.

(21) Appl. No.: 17/022,598

(22) Filed: Sep. 16, 2020

(65) Prior Publication Data
US 2021/0217816 A1 Jul. 15, 2021

(30) Foreign Application Priority Data
Jan. 13, 2020 (KR) .................. 10-2020-0004068

(51) Int. Cl.
*H01L 27/32* (2006.01)
*H01L 51/52* (2006.01)
*H01L 51/50* (2006.01)

(52) U.S. Cl.
CPC ........ *H01L 27/322* (2013.01); *H01L 27/3246* (2013.01); *H01L 51/502* (2013.01); *H01L 51/5237* (2013.01)

(58) Field of Classification Search
CPC .............. H01L 27/322; H01L 27/3246; H01L 51/502; H01L 51/5237
USPC ......................................................... 257/40
See application file for complete search history.

(56) References Cited

U.S. PATENT DOCUMENTS

| 7,129,633 B2 | 10/2006 | Kosyachkov |
| 2006/0012296 A1 | 1/2006 | Eida et al. |
| 2018/0179441 A1 | 6/2018 | Park et al. |
| 2019/0157354 A1* | 5/2019 | Lee ...................... H01L 27/322 |
| 2020/0006437 A1 | 1/2020 | Kim et al. |

FOREIGN PATENT DOCUMENTS

| JP | 2016122606 A2 | 7/2016 |
| JP | 2019012284 A2 | 1/2019 |
| KR | 10-2005-0051699 A | 6/2005 |

(Continued)

*Primary Examiner* — Xia L Cross
(74) *Attorney, Agent, or Firm* — Lewis Roca Rothgerber Christie LLP

(57) ABSTRACT

A display panel and a manufacturing method of a display panel are provided. A display panel includes: a base substrate in which a pixel area and a peripheral area adjacent to the pixel area are defined; a light emitting element located on the base substrate to overlap the pixel area, and configured to generate first light; a light control layer on the light emitting element; a color filter layer on the light control layer; and a capping layer contacting at least the light control layer and including silicon oxynitride (SiON), and the capping layer contains about 34 at % to about 41 at % of oxygen, and about 18 at % to about 25 at % of nitrogen. Luminous efficiency of the display panel may be increased while maintaining durability of the display panel.

20 Claims, 13 Drawing Sheets

(56) References Cited

FOREIGN PATENT DOCUMENTS

| KR | 10-2005-0053653 A | 6/2005 |
| KR | 10-2018-0077086 A | 7/2018 |
| KR | 10-1969193 B1 | 4/2019 |

\* cited by examiner

DISPLAY PANEL INCLUDING A LIGHT CONTROL LAYER AND A CAPPING LAYER

CROSS-REFERENCE TO RELATED APPLICATION

This application claims priority to and the benefit of Korean Patent Application No. 10-2020-0004068, filed on Jan. 13, 2020 in the Korean Intellectual Property Office, the entire content of which is hereby incorporated by reference.

BACKGROUND

1. Field

Aspects of embodiments of the present disclosure relate to a display panel and a method of manufacturing the same.

2. Description of the Related Art

Display panels include a transmissive display panel that selectively transmits source light generated from a light source and a light emitting display panel that generates source light in the display panel itself. The display panels may include different types of color control layers according to pixels to generate color images. The color control layers may transmit only a partial wavelength range of the source light or convert the color of the source light. Some color control layers may change the properties of light without converting the color of the source light.

SUMMARY

According to aspects of embodiments of the present disclosure, a display panel having increased luminance due to improved pixel integration degree and having improved reliability and mass productivity, and a method of manufacturing the same, are provided. According to another aspect of embodiments of the present disclosure, a display panel having increased durability and luminous efficiency is provided.

According to another aspect of embodiments of the present disclosure, a display panel including a protective layer capable of protecting a light emitting material included in a light control layer without a reduced luminous efficiency is provided.

According to one or more embodiments, a display panel includes: a base substrate in which a pixel area and a peripheral area adjacent to the pixel area are defined; a light emitting element located on the base substrate to overlap the pixel area and configured to generate first light; a light control layer on the light emitting element; a color filter layer on the light control layer; and a capping layer contacting at least the light control layer and including silicon oxynitride (SiON), wherein the capping layer contains about 34 at % to about 41 at % of oxygen, and about 18 at % to about 25 at % of nitrogen.

The capping layer may include a first capping layer between the light emitting element and the color filter layer.

The capping layer may further include a second capping layer between the light emitting element and the light control layer.

The capping layer may have a refractive index of about 1.6 to about 1.7.

The capping layer may include a first layer and a second layer having a greater density than the first layer.

The light control layer may include a first light conversion part to convert the first light into second light, a second light conversion part to convert the first light into third light, and a transmission part to transmit the first light.

The color filter layer may include a first color filter overlapping the first light conversion part on a plane to transmit the second light, a second color filter overlapping the second light conversion part on a plane to transmit the third light, and a third color filter overlapping the transmission part on a plane to transmit the first light.

A height of the transmission part may be greater than heights of the first light conversion part and the second light conversion part.

The light control layer may further include partition walls respectively located between the first light conversion part, the second light conversion part, and the transmission part.

The light control layer may include a plurality of quantum dots.

The display panel may further include an encapsulation member on the light emitting element and including an inorganic layer at an outermost portion, and the light control layer may contact the inorganic layer.

The display panel may further include a filling layer between the encapsulation member and the light control layer.

The capping layer may contact an upper surface and a lower surface of the light control layer.

The first light may be light of a wavelength of about 410 nm to about 480 nm, the second light may be light of a wavelength of about 500 nm to about 570 nm, and the third light may be light of a wavelength of about 625 nm to about 675 nm.

The display panel may further include a pixel defining layer on the base substrate and including a plurality of openings corresponding to the pixel area defined therein, and the light emitting element may be located in the plurality of openings.

According to one or more embodiments, a display panel includes: a base substrate in which a pixel area and a peripheral area adjacent to the pixel area are defined; a light emitting element located on the base substrate to overlap the pixel area; a light control layer on the light emitting element; a color filter layer on the light control layer; and a first capping layer between the light control layer and the color filter layer and including silicon oxynitride (SiON), wherein the first capping layer has a refractive index of about 1.6 to about 1.7.

The display panel may further include a second capping layer between the light emitting element and the light control layer, wherein the second capping layer may include silicon nitride ($SiN_x$).

The first capping layer may include about 34 at % to about 41 at % of oxygen and about 18 at % to about 25 at % of nitrogen.

The first capping layer may contact an upper surface of the light control layer.

The first capping layer may include a first layer and a second layer having a greater density than the first layer.

BRIEF DESCRIPTION OF THE FIGURES

The accompanying drawings are included to provide a further understanding of the inventive concept, and are incorporated in and constitute a part of this specification. The drawings illustrate some example embodiments of the inventive concept and, together with the description, serve to explain principles of the inventive concept. In the drawings.

DETAILED DESCRIPTION

Figure 1:
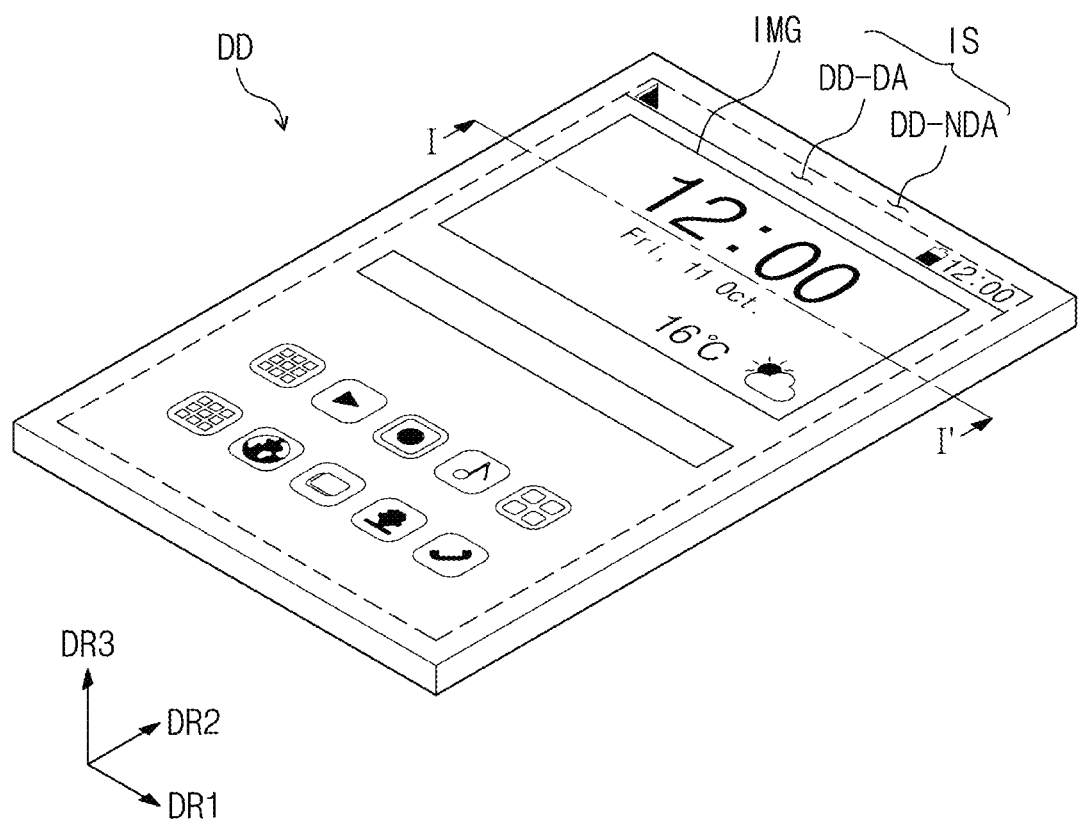
FIG. 1 is a perspective view of a display device according to an embodiment of the inventive concept.

Herein, some embodiments of the inventive concept will be described with reference to the accompanying drawings. However, it is to be understood that the present invention is not intended to be limited to the specific forms set forth herein, and all changes, equivalents, and substitutions included in the technical scope and spirit of the present invention are included. In the present disclosure, when an element (or a region, a layer, a portion, etc.) is referred to as being "on," "connected to," or "coupled to" another element, it means that the element may be directly connected to/coupled to the other element, or that one or more third elements may be disposed therebetween.

Like reference numerals refer to like elements. Also, in the drawings, the thickness, the ratio, and the dimensions of elements may be exaggerated for an effective description of technical contents. The term "and/or," includes all combinations of one or more of which associated configurations may define.

It is to be understood that, although the terms "first," "second," etc. may be used herein to describe various elements, these elements should not be limited by these terms. These terms are used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise," "include," or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms used herein (including technical or scientific terms) have the same meanings as those generally understood by those skilled in the art to which the inventive concept pertains. Such terms as those defined in a generally used dictionary are to be interpreted as having meanings equal to the contextual meanings in the relevant field of art, and are not to be interpreted as having idealized or excessively formal meanings unless clearly defined herein.

Herein, a display device, a display panel included in a display device, and a method of manufacturing a display panel according to embodiments of the inventive concept will be described.

Figure 2:
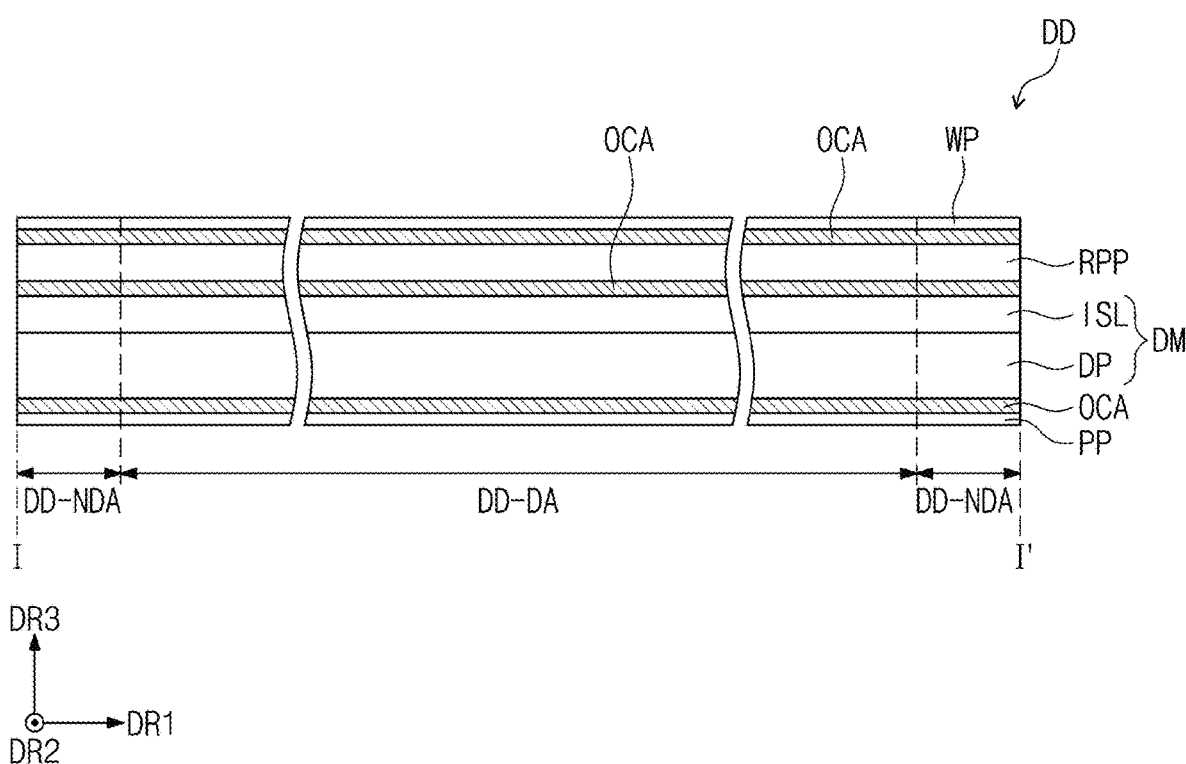
FIG. 2 is a cross-sectional view of a display device according to an embodiment of the inventive concept.

FIG. 1 is a perspective view of a display device according to an embodiment of the inventive concept; and FIG. 2 is a cross-sectional view of a display device according to an embodiment of the inventive concept.

As shown in FIG. 1, a display device DD may display an image IMG through a display surface IS. The display surface IS is parallel to a surface defined by a first direction DR1 and a second direction DR2. The normal direction of the display surface IS, that is, the thickness direction of the display device DD is indicated by a third direction DR3.

A front surface (or an upper surface) and a rear surface (or a lower surface) of each of members or units described below are separated by the third direction DR3. However, the first to third directions DR1, DR2, and DR3 shown in an embodiment are merely examples, and the present disclosure is not limited thereto.

In an embodiment of the inventive concept, a display device DD having a flat display surface is illustrated, but embodiments are not limited thereto. The display device DD may further include a curved display surface. The display device DD may include a three-dimensional display surface. The three-dimensional display surface may include a plurality of display areas indicating different directions, and may include, for example, a polygonal pillar display surface.

The display device DD according to an embodiment may be a rigid display device. However, embodiments of the inventive concept are not limited thereto, and the display device DD according to an embodiment of the inventive concept may be a flexible display device DD. The flexible display device DD may include a foldable display device or a bendable display device in which a partial portion is bent.

In an embodiment, a display device DD applicable to a mobile phone terminal is illustrated as an example. Although not shown, electronic modules, a camera module, a power module, etc., mounted on a motherboard, along with the display device DD, may be disposed in a bracket/case, etc. to form a mobile phone terminal. However, the display device DD according to embodiments of the inventive concept may be not only used for large-sized electronic devices, such as a television and a monitor, but also used for small and medium-sized electronic devices, such as a tablet, a car navigation unit, a game console, and a smart watch.

As shown in FIG. 1, the display surface IS includes an image area DD-DA on which an image IMG is displayed and a bezel area DD-NDA adjacent to the image area DD-DA. The bezel area DD-NDA is an area where no image is displayed. FIG. 1 illustrates icon images as an example of the image IMG.

As shown in FIG. 1, the image area DD-DA may have substantially a rectangular shape. The term "substantially a rectangular shape" not only refers to a rectangular shape in a mathematical sense, but also refers to a rectangular shape in which no vertex is defined in the vertex region (or corner region) but the boundary of a curve is defined.

The bezel area DD-NDA may surround the image area DD-DA. However, embodiments of the inventive concept are not limited thereto, and the image area DD-DA and the bezel area DD-NDA may be configured in different shapes. For example, the bezel area DD-NDA may be disposed on only one side of the image area DD-DA. Depending on the combination of the display device DD and other elements of an electronic device, the bezel area DD-NDA may not be exposed to the outside.

FIG. 2 is a cross-sectional view of a display device according to an embodiment of the inventive concept. FIG. 2 illustrates a cross-section defined by the first direction DR1 and the third direction DR3 taken along the line I-I' of FIG. 1. FIG. 2 is illustrated in a simplified manner in order to describe a stacking structure of a functional panel and/or functional units constituting the display device DD.

A display device DD according to an embodiment of the inventive concept may include a protection unit, a display panel, an input detection sensor, an anti-reflection unit, and a window. Some elements of the protection unit, the display panel, the input detection sensor, and the anti-reflection unit may be formed by a continuous process, or some elements may be bonded to each other through an adhesive member. FIG. 2 illustrates, as an example, an optically clear adhesive OCA as the adhesive member. The adhesive member described below may include a typical adhesive material or a gluing agent. In an embodiment of the inventive concept, any of the protection unit, the anti-reflection unit, and the input detection sensor may be replaced with another element or may be omitted.

In FIG. 2, among the protection unit, the input detection sensor, and the anti-reflection unit, an element formed through the continuous process with another element is referred to as a "layer." Among the protection unit, the input detection sensor, and the anti-reflection unit, an element binding with another element through an adhesive member is referred to as a "panel." The panel includes a base layer that provides a base surface, such as a resin film, a composite film, and a glass substrate, but for the "layer," the base layer may be omitted. In other words, the units referred to as the "layer" are disposed on the base surface provided by another unit.

The protection unit, the input detection sensor, and the anti-reflection unit may be referred to as a protection panel, an input detection panel, and an anti-reflection panel or a protection layer, an input sensing layer, and an anti-reflection layer according to the presence or absence of the base layer.

As shown in FIG. 2, in an embodiment, the display device DD may include a protection panel PP, a display panel DP, an input sensing layer ISL, an anti-reflection panel RPP, and a window WP. In an embodiment, the input sensing layer ISL is directly disposed on the display panel DP. In the description, "an element B is directly disposed on an element A" indicates that no adhesive layer/adhesive member is disposed between the element A and the element B. The element B may be formed through a continuous process on the base surface provided by the element A after the element A is formed.

A display module DM may be defined to include the display panel DP and the input sensing layer ISL directly disposed on the display panel DP. The optically clear adhesive OCA may be disposed between the protection panel PP and the display module DM, between the display module DM and the anti-reflection panel RPP, and between the anti-reflection panel RPP and the window WP, respectively.

The display panel DP generates images, and the input sensing layer ISL obtains coordinate information of an external input (e.g., a touch event). The protection panel PP is disposed below the display module DM to protect the display module DM from external impacts. In an embodiment, the protection panel PP may be replaced in the form of a protective layer. That is, the protective layer may be directly disposed below the display module DM.

In an embodiment, the protection panel PP may include a synthetic resin film or a metal plate. In an embodiment, the protection panel PP may have a multilayer structure including a plurality of synthetic resin films and/or a plurality of metal plates.

The display panel DP according to an embodiment of the inventive concept may be a light emitting display panel, but is not particularly limited thereto. For example, the display panel DP may be an organic light emitting display panel, a quantum dot light emitting display panel, or a micro LED display panel. Panels are distinguished according to the configuration of a light emitting element. The emission layer of the organic light emitting display panel may include an organic light emitting material. The emission layer of the quantum dot light emitting display panel may include a quantum dot and/or a quantum rod. The micro LED display panel may include a micro LED element and/or a nano LED element, which is an ultraminiature light emitting element.

The anti-reflection panel RPP reduces reflectance of external light incident from an upper side of the window WP. The anti-reflection panel RPP according to an embodiment of the inventive concept may include a phase retarder and a polarizer. The phase retarder may be a film type or a liquid crystal coating type, and may include a $\lambda/2$ phase retarder and/or a $\lambda/4$ phase retarder. The polarizer may also be a film type or a liquid crystal coating type. The film type may include an elongated synthetic resin film, and the liquid crystal coating type may include liquid crystals in an arrangement (e.g., a predetermined arrangement) on the base layer. In an embodiment, the phase retarder and the polarizer may further include a protection film.

The anti-reflection panel RPP according to an embodiment of the inventive concept may include a destructive interference structure disposed on the base layer. For example, the destructive interference structure may include a first reflection layer and a second reflection layer disposed on different layers. A first reflection light and a second reflection light, which are respectively reflected by the first reflection layer and the second reflection layer, may destructively interfere with each other, thereby reducing reflectance of the external light.

In a display device according to an embodiment, the anti-reflection panel RPP may be omitted and the anti-reflection layer may be disposed on the input sensing layer ISL. Further, the stacking order of the anti-reflection layer and the input sensing layer ISL may be varied. The display device according to an embodiment may include an input sensing panel instead of the input sensing layer ISL. The input sensing panel may be adhered to the display module DM through a clear adhesive. Further, the stacking order of the input sensing panel and the anti-reflection panel RPP may be varied. The display device according to an embodiment may have a structure in which the input sensing layer, the anti-reflection layer, and the window WP are sequentially stacked on the display panel DP.

The window WP according to an embodiment of the inventive concept may include a base layer and a light shielding pattern. The base layer may include a glass substrate and/or a synthetic resin film. The base layer is not limited to a single layer. The base layer may include two or more films bonded by an adhesive member.

The light shielding pattern partially overlaps the base layer. The light shielding pattern may be disposed on a rear surface of the base layer, and the light shielding pattern may substantially define the bezel area DD-NDA of the display device DD. An area where the light shielding pattern is not disposed may define the image area DD-DA of the display device DD. When limited to the window WP, an area where the light shielding pattern is disposed is defined as a light shielding area of the window WP, and an area where the light shielding pattern is not disposed is defined as a transmission area of the window WP.

In an embodiment, the light shielding pattern may have a multilayer structure. The multilayer structure may include a chromatic color layer and an achromatic (e.g., black) light shielding layer. The chromatic color layer and the achromatic light shielding layer may be formed through any of deposition, printing, and coating processes. Although not separately shown, in an embodiment, the window WP may further include a functional coating layer disposed on a front surface of the base layer. The functional coating layer may include an anti-fingerprint layer, an anti-reflection layer, a hard coating layer, etc.

Figure 3:
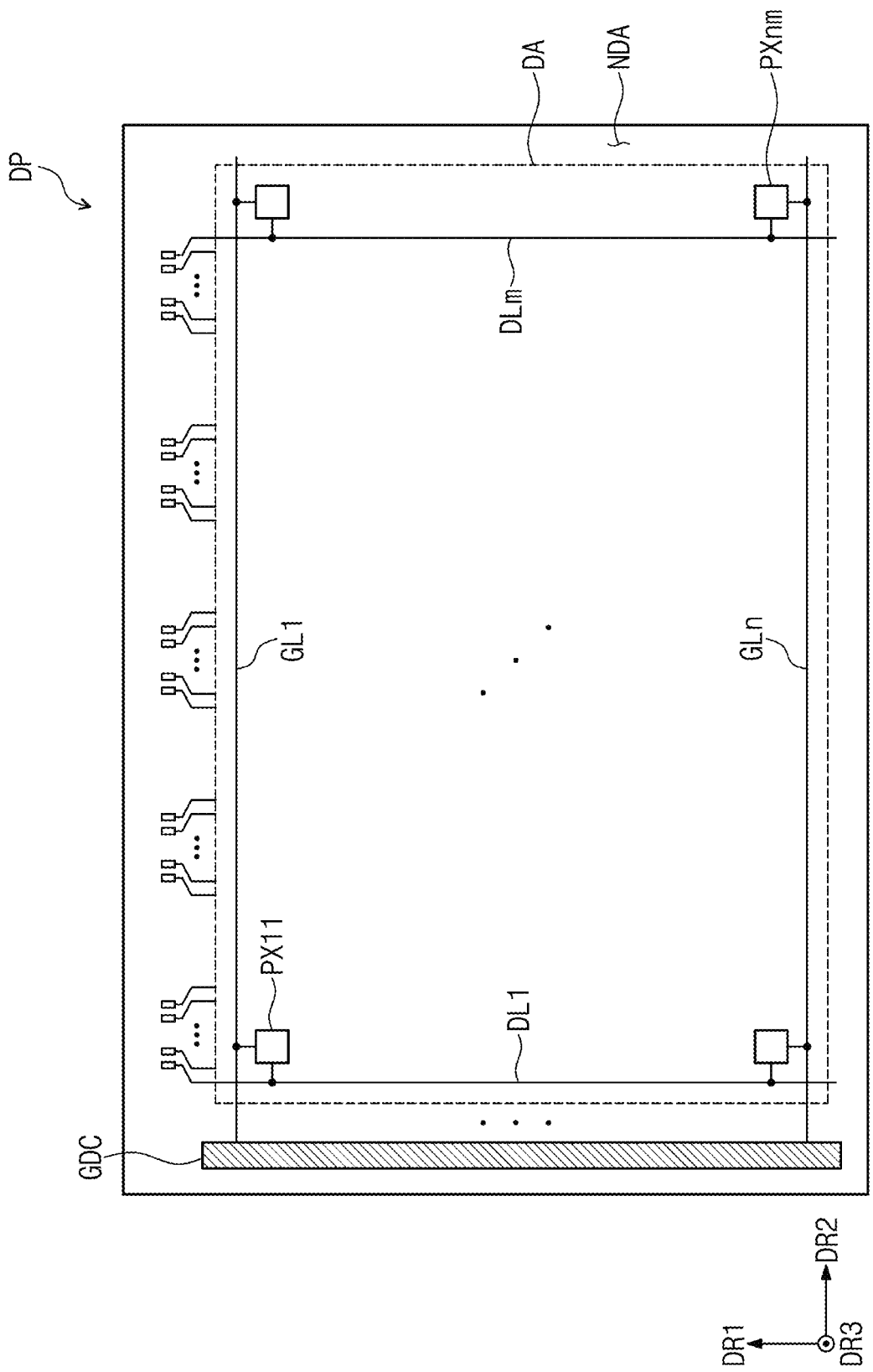
FIG. 3 is a plan view of a display panel according to an embodiment of the inventive concept.

FIG. 3 is a plan view of a display panel according to an embodiment of the inventive concept. FIG. 3 illustrates a planar arrangement of signal lines GL1 to GLn and DL1 to DLm and pixels PX11 to PXnm. The signal lines GL1 to GLn and DL1 to DLm may include a plurality of gate lines GL1 to GLn and a plurality of data lines DL1 to DLm.

Each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a light emitting element. According to a configuration of the pixel driving circuit, more types of signal lines may be provided in the display panel DP.

The pixels PX11 to PXnm may be disposed in the form of a matrix, but are not limited thereto. In an embodiment, the pixels PX11 to PXnm may be disposed in the form of a pentile arrangement. In an embodiment, the pixels PX11 to PXnm may be disposed in the form of a diamond arrangement.

A gate driving circuit GDC may be disposed in a non-display area NDA. In an embodiment, the gate driving circuit GDC may be integrated in the display panel DP through an oxide silicon gate driver circuit (OSG) or an amorphous silicon gate driver circuit (ASG) process.

Figure 4:
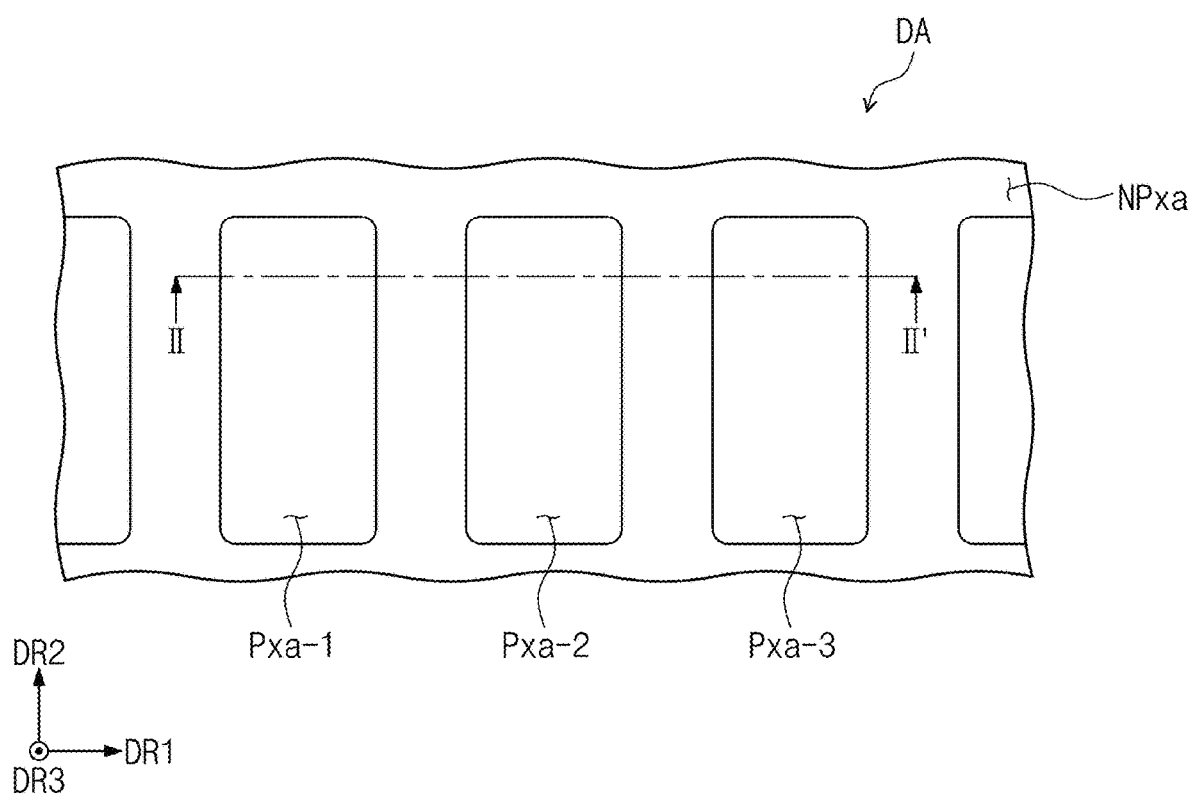
FIG. 4 is a plan view of pixel areas of a display panel according to an embodiment of the inventive concept.

FIG. 4 is a plan view of pixel areas of a display panel according to an embodiment of the inventive concept.

FIG. 4 is an enlarged view of a part of a display area DA shown in FIG. 3. FIG. 4 mainly illustrates three pixel areas Pxa-1, Pxa-2, and Pxa-3. The three pixel areas Pxa-1, Pxa-2, and Pxa-3 shown in FIG. 4 may be repeatedly disposed in the entire display area DA.

Referring to FIG. 4, a peripheral area NPxa is disposed around the first to third pixel areas Pxa-1, Pxa-2, and Pxa-3. The peripheral area NPxa sets the boundaries of the first to third pixel areas Pxa-1, Pxa-2, and Pxa-3 to prevent or substantially prevent a color mixture among the first to third pixel areas Pxa-1, Pxa-2, and Pxa-3. In addition, the peripheral area NPxa blocks source light to prevent or substantially prevent the source light from being provided to users.

In an embodiment, the first to third pixel areas Pxa-1, Pxa-2, and Pxa-3 having a same planar area are illustrated as an example, but embodiments are not limited thereto, and the first to third pixel areas Pxa-1, Pxa-2, and Pxa-3 may have different areas, or at least two or more areas may be different. Although rectangular first to third pixel areas Pxa-1, Pxa-2, and Pxa-3 having rounded corner areas on a plane are illustrated, embodiments are not limited thereto. The first to third pixel areas Pxa-1, Pxa-2, and Pxa-3 may be in another form of a polygon on a plane, and may be in the form of a regular polygon having rounded corner areas.

One of the first to third pixel areas Pxa-1, Pxa-2, and Pxa-3 may provide first light to users, another may provide second light which is different from the first light, and the other may provide third light which is different from the first light and the second light. In an embodiment, the first pixel area Pxa-1 may provide red light, the second pixel area Pxa-2 may provide green light, and the third pixel area Pxa-3 may provide blue light. In an embodiment, the first pixel area Pxa-1 may provide light in a wavelength region of about 625 nm to about 675 nm, the second pixel area Pxa-2 may provide light in a wavelength region of about 500 nm to about 570 nm, and the third pixel area Pxa-3 may provide light in a wavelength region of about 410 nm to about 480 nm. In an embodiment, the source light may be blue light which is the first light. The source light is the first light and may be light in a wavelength region of about 410 nm to about 480 nm. The source light may be generated in a light source such as a backlight unit or in an element such as a light emitting diode.

Figure 5:
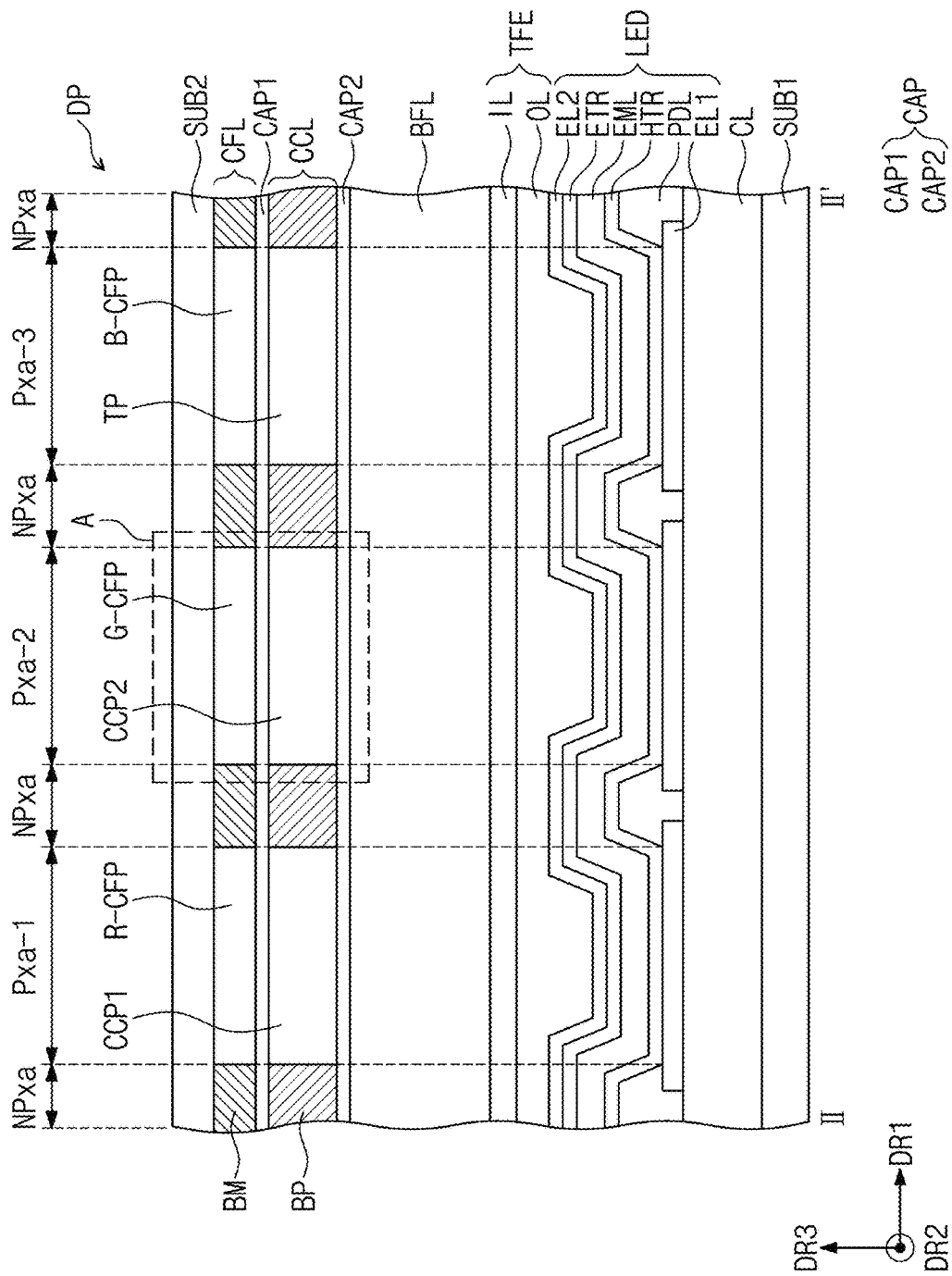
FIG. 5 is a cross-sectional view of a display panel according to an embodiment of the inventive concept.
Figure 6:
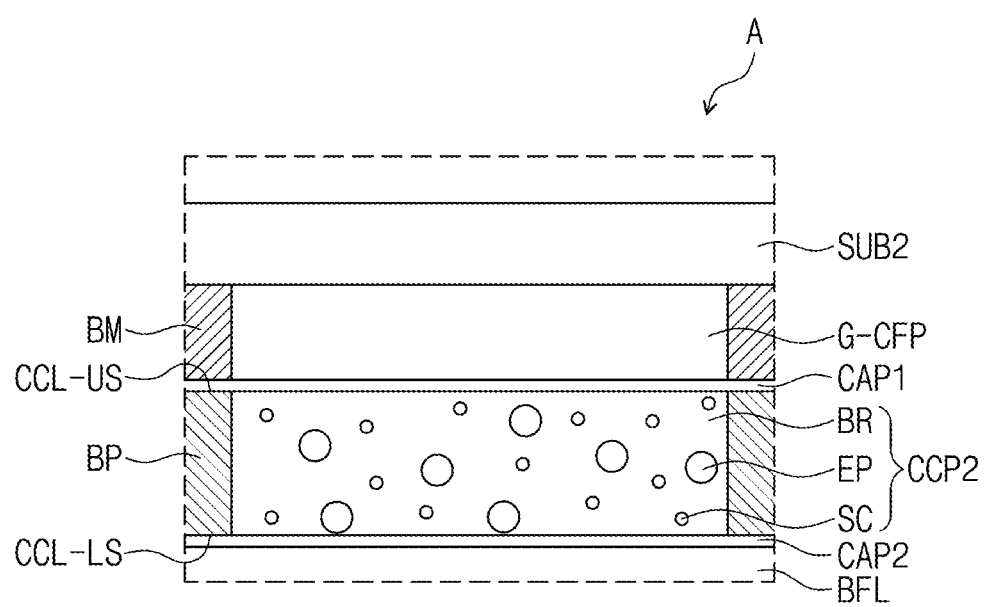
FIG. 6 is an enlarged cross-sectional view of a region "A" of FIG. 5.

FIG. 5 is a cross-sectional view of a display panel according to an embodiment of the inventive concept. FIG. 5 illustrates a cross-section taken along the line II-II' of FIG. 4; and FIG. 6 is an enlarged cross-sectional view of a region "A" of FIG. 5.

Referring to FIG. 5, a display panel DP according to an embodiment includes a circuit element layer CL disposed on a first base substrate SUB1, a light emitting element layer LED disposed on the circuit element layer CL, an encapsulation member TFE disposed on the light emitting element layer LED, and a filling layer BFL disposed on the encapsulation member TFE. An upper substrate of the display panel DP includes a second base substrate SUB2, a color filter layer CFL disposed below the second base substrate SUB2, and a light control layer CCL disposed below the color filter layer CFL.

The first base substrate SUB1 and the second base substrate SUB2 may be each independently a polymer substrate, a plastic substrate, a glass substrate, a quartz substrate, etc. The first base substrate SUB1 and the second base substrate SUB2 may be transparent insulating substrates. In an embodiment, the first base substrate SUB1 and the second base substrate SUB2 each may be rigid. In an embodiment, the first base substrate SUB1 and the second base substrate SUB2 each may be flexible. In FIG. 5, the display panel DP includes the first base substrate SUB1 and the second base substrate SUB2, but embodiments are not limited thereto, and in the display panel DP of an embodiment of the inventive concept, at least one of the first base substrate SUB1 and the second base substrate SUB2 may be omitted.

In an embodiment, the display panel DP may include a first light emitting element overlapping the first pixel area Pxa-1, a second light emitting element overlapping the second pixel area Pxa-2, and a third light emitting element overlapping the third pixel area Pxa-3.

Each of the first to third light emitting elements may include a first electrode EL1, a hole transport region HTR, an emission layer EML, an electron transport region ETR, and a second electrode EL2, which are sequentially stacked.

In an embodiment, the emission layer EML of the first to third light emitting elements may be a single body, and may be commonly disposed in the pixel areas Pxa-1, Pxa-2, and Pxa-3 and the peripheral area NPxa. The emission layer EML may generate the first light. For example, the emission layer EML may generate blue light. The first light generated by the emission layer EML may be light in a wavelength region of about 410 nm to about 480 nm. Although not separately illustrated, in an embodiment, the light emitting elements corresponding to the first to third pixel areas Pxa-1, Pxa-2, and Pxa-3 may have a patterned emission layer EML, respectively, and, in this case, the light emitting elements corresponding to the first to third pixel areas Pxa-1, Pxa-2, and Pxa-3 may generate light of different colors.

The light emitting element layer LED may further include a pixel defining layer PDL. The pixel defining layer PDL may include an organic material. An opening of the pixel defining layer PDL exposes at least a portion of the first electrode EL1. The openings of the pixel defining layer PDL may define the pixel areas Pxa-1, Pxa-2, Pxa-3 of the pixel. However, in an embodiment, the pixel defining layer PDL may be omitted.

The encapsulation member TFE is disposed on the light emitting element layer LED to seal the light emitting element layer LED. In an embodiment, the encapsulation member TFE may include an inorganic film IL disposed at an outermost portion thereof. The encapsulation member TFE may further include an organic film OL, or may have a structure in which the inorganic film IL and the organic film OL are alternately repeated. The encapsulation member TFE may protect the light emitting element layer LED from moisture/oxygen and may serve to protect the light emitting element layer LED from foreign substances, such as dust particles.

In an embodiment, the inorganic film IL may include any material without specific limitation as long as it is a material capable of protecting the light emitting element layer LED positioned thereunder; for example, silicon nitride ($SiN_x$), silicon oxynitride (SiON), silicon oxide ($SiO_y$), titanium oxide ($TiO_y$), aluminum oxide ($AlO_y$), etc. may be included. In an embodiment, the inorganic film IL may include silicon nitride ($SiN_x$).

The organic film OL may include an acrylate-based organic material, but is not particularly limited thereto. The inorganic film IL may be formed by a deposition method, etc., and the organic film OL may be formed by a deposition method, a coating method, etc.

FIG. 5 illustrates an embodiment in which the encapsulation member TFE includes one organic film OL and one inorganic film IL; however, embodiments of the present disclosure are not limited thereto, and the encapsulation member TFE may include a plurality of organic films OL and inorganic films IL. For example, the encapsulation member TFE may have a form in which two inorganic films IL are disposed with one organic film OL therebetween. In another embodiment, the encapsulation member TFE may have a form in which two or more organic films OL and two or more inorganic films IL are alternately stacked multiple times.

In an embodiment, the display panel DP may include a light control layer CCL. The light control layer CCL may be disposed on the light emitting element layer LED. The light control layer CCL may be disposed on a plurality of light emitting elements, and may be spaced apart from the encapsulation member TFE with a filling layer BFL therebetween.

The light control layer CCL may include a transmission part TP that transmits first light, a first light conversion part CCP1 that converts the first light into second light, and a second light conversion part CCP2 that converts the first light into third light. For example, the second light may be green light, and the green light may correspond to light in a wavelength region of about 500 nm to about 570 nm. The third light may be red light and may correspond to light in a wavelength region of about 625 nm to about 675 nm.

In an embodiment, the first light conversion part CCP1 and the second light conversion part CCP2 may include a light emitter. The light emitter may be a particle that converts the wavelength of light. In an embodiment, the light emitter included in the first light conversion part CCP1 and the second light conversion part CCP2 may be a quantum dot.

Quantum dots are materials of a few nanometers in size, containing hundreds to thousands of atoms, and exhibiting a quantum confinement effect in which an energy band gap is increased due to its small size. When light of a wavelength having higher energy than the band gap is incident on the quantum dots, the quantum dots absorb the light to be excited, and fall to a ground state while emitting light of a specific wavelength. The emitted light of a specific wavelength has a value corresponding to the band gap. When the quantum dots are adjusted in size and composition, light emitting properties due to the quantum confinement effect may be controlled.

A Group II-VI compound may be selected from any of the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A Group compound may be selected from a ternary compound selected from the group consisting of $AgInS_2$, $CuInS_2$, $AgGaS_2$, $CuGaS_2$, and a mixture thereof, or a quaternary compound, such as $AgInGaS_2$, $CuInGaS_2$.

A Group III-V compound may be selected from any of the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a metal of a Group II. For example, InZnP may be selected as a Group III-II-V compound.

A Group IV-VI compound may be selected from any of the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbTe, SnPbS, SnPbSe, SnPbTe, and a mixture thereof, and a quaternary compound selected from the group consisting of SnPbSSe, SnPbSeTe, SnPbSTe, and a mixture thereof. A Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in a particle with a uniform concentration distribution, or may be present in the same particle with a partially different concentration. In an embodiment, a quantum dot may have a core-shell structure in which one quantum dot surrounds another quantum dot. An interface between a core and a shell may have a concentration gradient in which the concentration of an element present in the shell becomes lower toward the center.

In some embodiments, a quantum dot may have the above-described core-shell structure including a core having nano-crystals and a shell surrounding the core. The shell of the quantum dot may serve as a protective layer to prevent or substantially prevent the chemical deformation of the core so as to maintain semiconductor properties, and/or a charging layer to impart electrophoresis properties to the quantum dot. The shell may be a single layer or multiple layers. An interface between a core and a shell may have a concentration gradient in which the concentration of an element present in the shell becomes lower toward the center. An example of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments of the inventive concept are not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the inventive concept are not limited thereto.

In an embodiment, a quantum dot may have a full width of half maximum (FWHM) of a light emission wavelength spectrum of about 45 nm or less, and, in an embodiment, about 40 nm or less, and, in an embodiment, about 30 nm or less, and color purity or color reproducibility may be improved in the above range. In addition, light emitted through such quantum dot is emitted in all directions such that a wide viewing angle may be improved.

In addition, although the form of a quantum dot is not particularly limited as long as it is a form commonly used in the art; for example, a quantum dot in the form of spherical, pyramidal, multi-arm, or cubic nanoparticles, nanotubes, nanowires, nanofibers, nanoparticles, etc. may be used.

A quantum dot may control the color of emitted light according to the particle size thereof. Accordingly, the quantum dot may have various light emission colors such as blue, red, and green. The smaller the particle size of the quantum dot becomes, light in the short wavelength region may be emitted. For example, the particle size of a quantum dot emitting green light may be smaller than the particle size of a quantum dot emitting red light. In addition, the particle size of a quantum dot emitting blue light may be smaller than the particle size of a quantum dot emitting green light.

In an embodiment, the light control layer CCL may include a base resin and a light emitter. The light control layer CCL may further include scattering particles. The light emitter and the scattering particles may be included in each of a light conversion part and a transmission part included in the light control layer CCL. However, embodiments of the inventive concept are not limited thereto, and the light emitter and the scattering particles may be included in only a part of the light control layer CCL.

The light control layer CCL may include a plurality of light conversion parts CCP1 and CCP2, and a transmission part TP. In an embodiment, each of the first light conversion part CCP1, the second light conversion part CCP2, and the transmission part TP may be disposed to be spaced apart from each other on a plane. Each of the first light conversion part CCP1, the second light conversion part CCP2, and the transmission part TP may be arranged to be spaced apart from each other on a plane defined by an axis of the first direction DR1 and an axis of the third direction DR3.

FIG. 5 illustrates that the first light conversion part CCP1, the second light conversion part CCP2, and the transmission part TP have a same area or thickness as each other, but embodiments are not limited thereto, and each of the first light conversion part CCP1, the second light conversion part CCP2, and the transmission part TP may have different areas or thicknesses. For example, the transmission part TP may have a smaller area than the first light conversion part CCP1 and the second light conversion part CCP2. The first light conversion part CCP1 may have a larger area than the second light conversion part CCP2 and the transmission part TP.

A partition wall BP may be disposed between the first light conversion part CCP1 and the second light conversion part CCP2, and between the second light conversion part CCP2 and the transmission part TP, which are spaced apart. The partition wall BP may overlap the peripheral area NPxa on a plane. The partition wall BP may prevent or substantially prevent light leakage and may define boundaries between adjacent light conversion parts CCP1 and CCP2, and the transmission part TP. In an embodiment, the partition wall BP may include an organic material. In an embodiment, the partition wall BP may include an organic light shielding material including a black pigment or a black dye. The partition wall BP may include an organic material having hydrophobicity.

In an embodiment, the color filter layer CFL may be disposed on the light control layer CCL and may include first to third color filters R-CFP, G-CFP, and B-CFP, and a light shielding pattern BM.

The first to third color filters R-CFP, G-CFP, and B-CFP may be disposed to be spaced apart from each other on a plane. Referring to FIG. 5, the first to third color filters R-CFP, G-CFP, and B-CFP may be spaced apart from each other along the first direction DR1.

The first color filter R-CFP may be disposed to correspond to the first light conversion part CCP1, block the first light and the third light, and transmit the second light. The second color filter G-CFP may be disposed to correspond to the second light conversion part CCP2, block the first light and the second light, and transmit the third light. The third color filter B-CFP may be disposed to correspond to the transmission part TP, block the second light and the third light, and transmit the first light. The first color filter R-CFP may include a red material, the second color filter G-CFP may include a green material, and the third color filter B-CFP may include a blue material. Accordingly, as the first light provided from the light control layer CCL is transmitted through the color filter layer CFL, the second light may be transmitted in the first pixel area Pxa-1 overlapping the first color filter R-CFP, the third light may be transmitted in the second pixel area Pxa-2 overlapping the second color filter G-CFP, and the first light may be transmitted in the third pixel area Pxa-3 overlapping the third color filter B-CFP. As the display device DD includes the color filter layer CFL, external light reflection may be effectively reduced and a color mixture may be prevented or substantially prevented.

The light shielding pattern BM is provided corresponding to the peripheral area NPxa. The light shielding pattern BM may be formed by include an organic light shielding material or an inorganic light shielding material including a black pigment or a black dye. The light shielding pattern BM may prevent or substantially prevent light leakage, and may define boundaries between adjacent color filters R-CFP, G-CFP, and B-CFP. At least a part of the light shielding pattern BM may be disposed to overlap a neighboring color filter R-CFP, G-CFP, and B-CFP. On a plane defined by the axis of the first direction DR1 and the axis of the third direction DR3, the light shielding pattern BM may be disposed such that at least a part of the light shielding pattern BM overlaps neighboring color filters R-CFP, G-CFP, and B-CFP in the thickness direction. FIG. 5 illustrates that the light shielding pattern BM overlaps all of the color filters R-CFP, G-CFP, and B-CFP in the thickness direction, such that the thickness of the light shielding pattern BM is the same as the thickness of the entire color filter layer CFL, but embodiments of the inventive concept are not limited thereto, and, in an embodiment, the thickness of the light shielding pattern BM may be smaller than the thickness of the entire color filter layer CFL. In an embodiment of the inventive concept, the light shielding pattern BM is included in the color filter layer CFL but embodiments are not limited to thereto, and the light shielding pattern BM may be omitted.

A filling layer BFL may be disposed between the encapsulation member TFE and the light control layer CCL. The filling layer BFL is disposed between the encapsulation member TFE and the light control layer CCL to prevent the light control layer CCL from contacting the encapsulation member TFE and to improve light extraction efficiency of the display device DD.

In an embodiment, the filling layer BFL may fill a space between the encapsulation member TFE and the light control layer CCL. The filling of the space between the encapsulation member TFE and the light control layer CCL means that the space between the encapsulation member TFE and the light control layer CCL is filled with the filling layer BFL, and, thus, there is no internal space between the encapsulation member TFE and the light control layer CCL, which may mean that the filling layer BFL contacts the encapsulation member TFE and the light control layer CCL.

The filling layer BFL may prevent or substantially prevent a light emitter EP and/or scattering particles SC included in the light control layer CCL from being oxidized by internal air, and, accordingly, the light extraction efficiency of the display device DD may be maintained without a significant change.

In an embodiment, the filling layer BFL may be directly disposed on the inorganic film IL disposed at the outermost portion of an encapsulation member TFE. The filling layer BFL may include an inorganic binder, an organic binder, or a liquid crystal compound, but is not particularly limited thereto.

FIG. 5 illustrates an embodiment in which the filling layer BFL is disposed between the encapsulation member TFE and the light control layer CCL; however, embodiments of the present disclosure are not limited thereto, and in the display device DD according to an embodiment of the inventive concept, the filling layer BFL may be omitted. In this case, an air layer may be formed between the encapsulation member TFE and the light control layer CCL.

Referring to FIGS. 5 and 6, a display panel DP according to an embodiment includes a capping layer CAP contacting the light control layer CCL. The capping layer CAP may include a first capping layer CAP1 disposed between the light control layer CCL and the color filter layer CFL.

In an embodiment, the first capping layer CAP1 includes silicon oxynitride (SiON). In an embodiment, the first capping layer CAP1 includes about 34 at % to about 41 at % of oxygen and about 18 at % to about 25 at % of nitrogen. In other words, the first capping layer CAP1 includes about 34 at % to about 41 at % oxygen atoms relative to the total atoms included in the first capping layer CAP1, and includes about 18 at % to about 25 at % nitrogen atoms relative to the total atoms included in the first capping layer CAP1. In an embodiment, the first capping layer CAP1 may have a refractive index of about 1.6 to about 1.7.

The capping layer CAP according to an embodiment may further include a second capping layer CAP2. The second capping layer CAP2 may be disposed between the light control layer CCL and the filling layer BFL. The second capping layer CAP2 may be disposed on a lower surface of the light control layer CCL. In an embodiment, the second capping layer CAP2 may include silicon oxynitride (SiON), like the first capping layer CAP1. However, embodiments of the inventive concept are not limited thereto, and, in an embodiment, the second capping layer CAP2 may include silicon nitride ($SiN_x$). The second capping layer CAP2 may include silicon oxide ($SiO_y$), titanium oxide ($TiO_y$), aluminum oxide ($AlO_y$), etc.

The capping layer CAP may cover at least one surface of the light control layer CCL to protect a light emitter EP, etc. included in the light control layer CCL from foreign substances, such as oxygen and moisture, entering from the outside. The capping layer CAP may contact at least one of an upper surface and a lower surface of the light control layer CCL. In an embodiment, the first capping layer CAP1 may contact an upper surface CCL-US of the light control layer CCL to cover the light control layer CCL, and the second capping layer CAP2 may contact a lower surface CCL-LS of the light control layer CCL to cover the light control layer CCL.

In an embodiment, the light control layer CCL may include a light emitter EP, scattering particles SC, and a base resin BR.

The base resin BR is a medium in which light emitters EP are dispersed, and may be formed of various resin compositions, which may be generally referred to as a binder. However, embodiments of the inventive concept are not limited thereto, and any medium capable of dispersing the light emitters EP may be referred to as a base resin BR regardless of its name, additional different functions, and elements. The base resin BR may be a polymer resin. For example, the base resin BR may be an acrylic resin, a urethane resin, a silicone resin, an epoxy resin, etc. The base resin BR may be a transparent resin.

The light emitter EP may be a particle that converts the wavelength of light. In an embodiment, the light emitter EP may be a quantum dot.

The light emitter EP may be included in the light conversion parts CCP1 and CCP2 of the light control layer CCL to serve as a particle that converts the first light generated from the light emitting element layer LED into light having a different wavelength. In an embodiment, the light emitter EP included in the second light conversion part CCP2 may be a quantum dot that converts the first light, which is blue light, into the third light, which is green light. Although not shown, the light emitter EP included in the first light conversion part CCP1 may be a quantum dot that converts the first light, which is blue light, into second light, which is red light. The light emitter EP may be uniformly dispersed in the base resin BR.

The scattering particles SC may be $TiO_2$ or silica-based nanoparticles. The scattering particles SC may scatter light. In another embodiment of the inventive concept, the scattering particles SC may be omitted. The scattering particles SC may be uniformly dispersed in the base resin BR.

Figure 7:
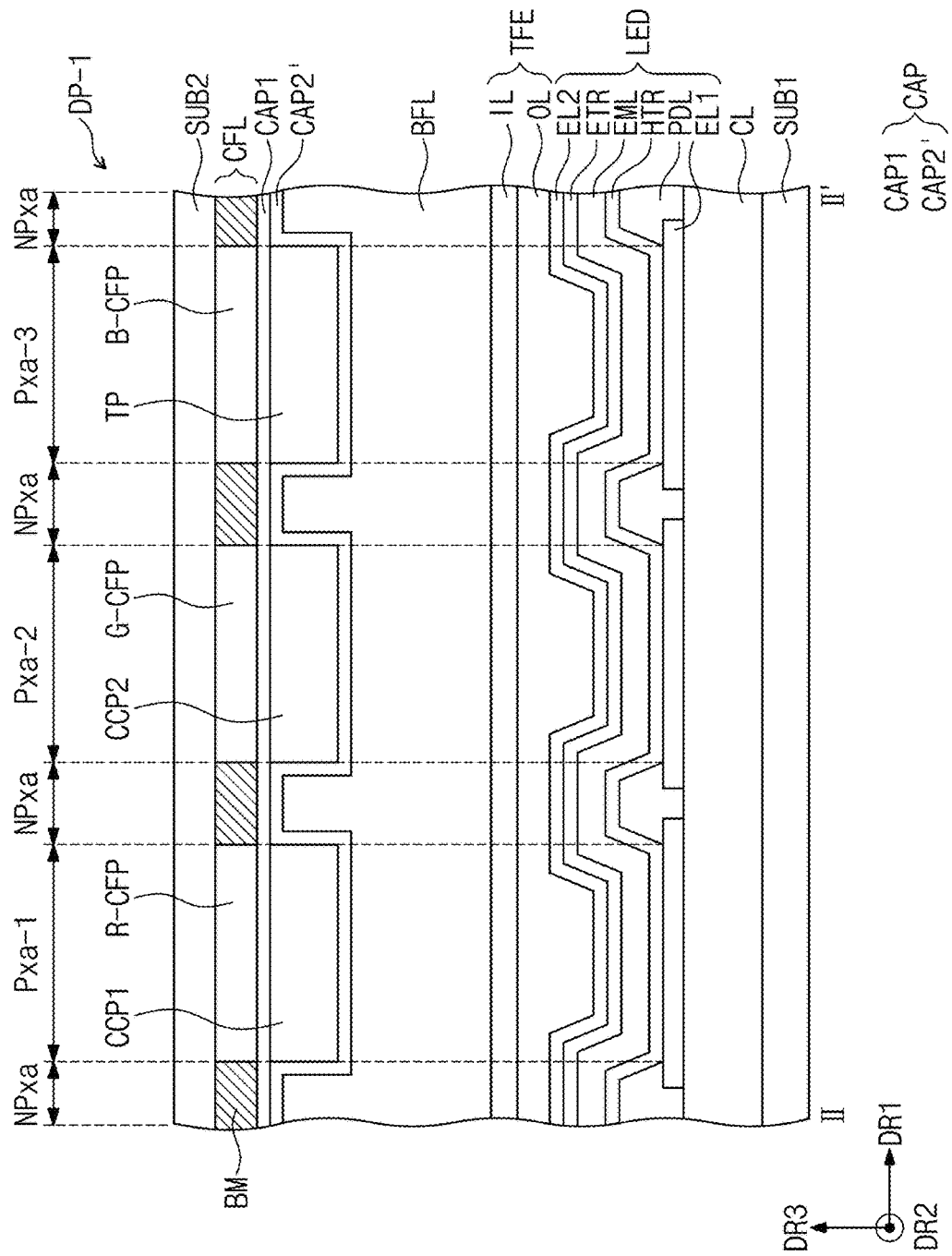
FIGS. 7 to 9 are cross-sectional views of a display panel according to some embodiments of the inventive concept.
Figure 8:
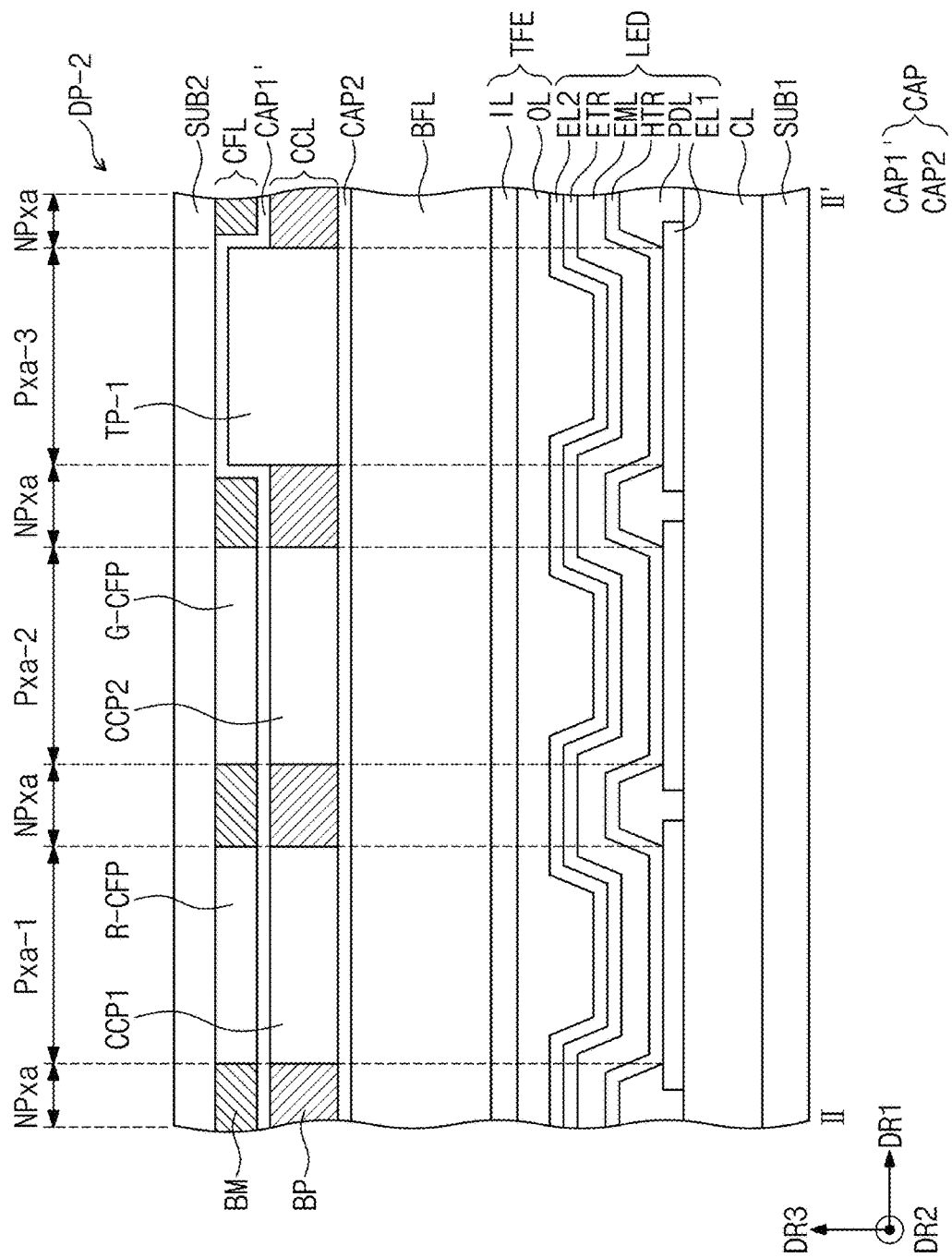
Figure 9:
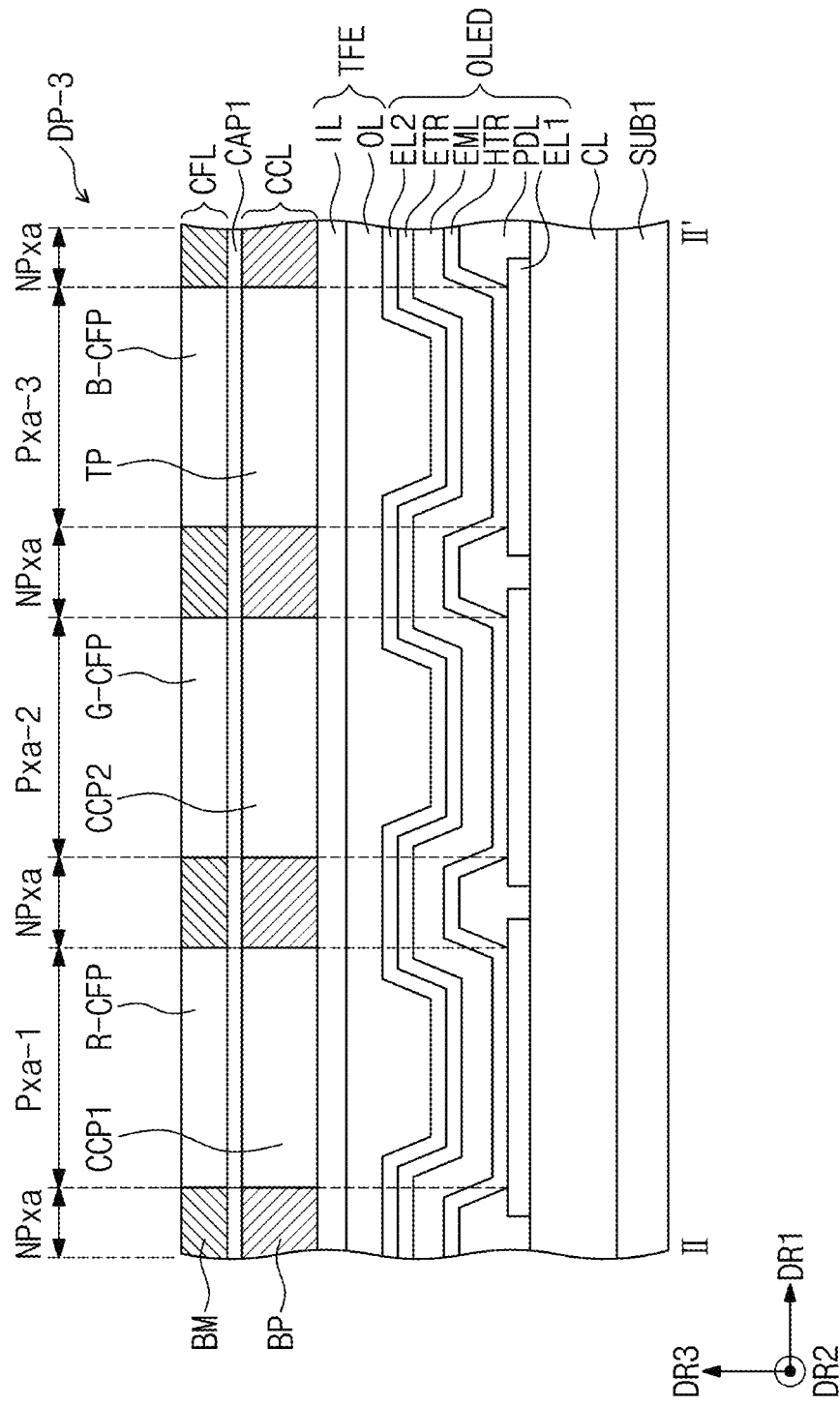

FIGS. 7 to 9 are cross-sectional views of a display panel according to some embodiments. Herein, in the description of display panels DP-1, DP-2, and DP-3 according to some embodiments of the inventive concept, like reference numerals are given to like elements as described above, and a repeated description thereof may be omitted.

Referring to FIG. 7, a display panel DP-1 according to an embodiment has a structure in which a partition wall BP is omitted in a light control layer CCL, compared to the display panel DP illustrated in FIG. 5. Accordingly, a second capping layer CAP2' included in the display panel DP-1 may have a structure covering a side surface in addition to a lower surface of light conversion parts CCP1 and CCP2 and a transmission part TP.

Referring to FIG. 8, a display panel DP-2 according to an embodiment may have a structure in which a third color filter B-CFP is omitted and a transmission part TP-1 is extended, compared to the display panel DP illustrated in FIG. 5. That is, compared to the display panel DP illustrated in FIG. 5, the display panel DP-2 may have a structure in which the transmission part TP and the third color filter B-CFP may have a single body to form an extended transmission part TP-1. Accordingly, the height of the extended transmission part TP-1 may be greater than the heights of each of the first light conversion part CCP1 and the second light conversion part CCP2. As the transmission part TP-1 has a form extending to the color filter layer CFL, the first capping layer CAP1' may have a form in which a curve is formed in the third pixel area Pxa-3 to cover an upper surface of the transmission part TP-1.

Referring to FIG. 9, compared to the display panel DP illustrated in FIG. 5, a display panel DP-3 according to an embodiment may have a structure in which a second base substrate SUB2, a filling layer BFL, and a second capping layer CAP2 are omitted. The display panel DP-3 according to an embodiment may have a structure in which each layer is consecutively formed on the base substrate SUB1.

In the display panel DP-3 according to an embodiment, the light control layer CCL may be directly formed on the encapsulation member TFE. Accordingly, the encapsulation member TFE may contact a lower surface of the light control layer CCL. The lower surface of the light control layer CCL may be in contact and covered by an inorganic film IL disposed at the outermost portion of the encapsulation member TFE.

In the display panel according to an embodiment, a capping layer covering a surface of a light control layer includes silicon oxynitride (SiON) having a refractive index of about 1.6 to about 1.7, such that a light emitter included in the light control layer is protected from foreign substances, such as oxygen and moisture, entering from the outside, and light efficiency is not reduced as compared to a case in which a capping layer includes a material having a high refractive index, thereby achieving high light efficiency. Compared to a case in which the capping layer covering an upper surface of the light control layer includes silicon nitride ($SiN_x$) having a high refractive index, the capping layer covering the upper surface of the light control layer includes silicon oxynitride (SiON) having a low refractive index, and the silicon oxynitride film included in the capping layer includes about 34 at % to about 41 at % of oxygen, and about 18 at % to about 25 at % of nitrogen to prevent or substantially prevent the light control layer from being damaged due to defects such as oxidation and prevent or substantially prevent the light efficiency of the display panel from being deteriorated.

Figure 10A:
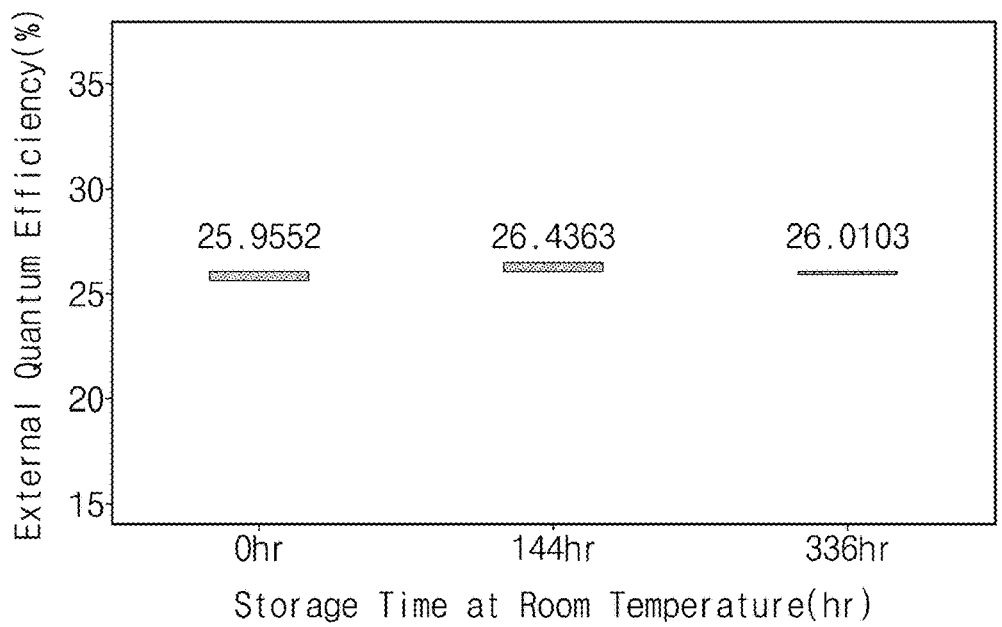
FIGS. 10A and 10B are graphs showing changes in external quantum efficiency according to storage time at room temperature with respect to display panels of some Examples and Comparative Examples.
Figure 10B:
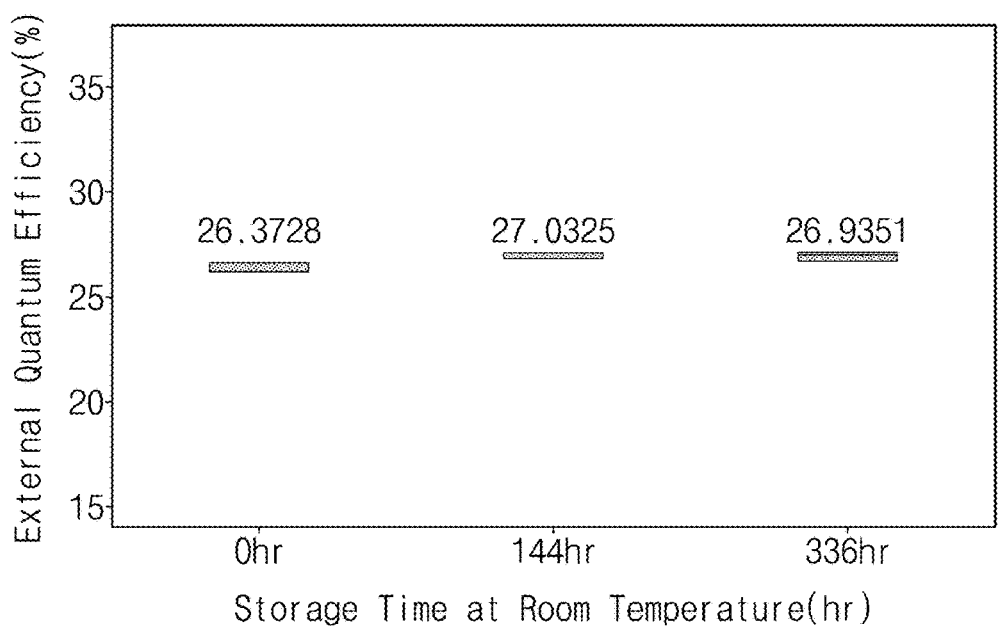

FIGS. 10A and 10B are graphs showing changes in external quantum efficiency according to storage time at room temperature with respect to the display panel of some Examples and Comparative Examples. FIG. 10A is a graph showing a case of a Comparative Example in which a capping layer disposed on a light control layer includes silicon nitride; and FIG. 10B is a graph showing a case of an Example in which a capping layer disposed on a light control layer includes silicon oxynitride. In the Examples shown in FIG. 10B, the element content ratio of the capping layer of each Example according to the XPS analysis of is shown in Table 1 below.

TABLE 1

| Example | Element content ratio (at %) | | |
|---|---|---|---|
| | Si | O | N |
| Example 1 | 40.5 | 40.7 | 18.8 |
| Example 2 | 40.9 | 34.2 | 24.9 |

Referring to the results of FIGS. 10A and 10B, compared to the display panel of the Comparative Example in which a capping layer including silicon nitride is disposed on a light control layer, it was confirmed that the display panel according to an embodiment of the inventive concept has a higher external quantum efficiency value in all cases of initial storage, storage for 144 hours at room temperature, and storage for 336 hours at room temperature. Therefore, as in the Example, the capping layer disposed on the light control layer includes silicon oxynitride, and, in particular, as shown in Table 1, the capping layer includes about 34 at % to about 41 at % of oxygen, and about 18 at % to about 25 at % of nitrogen, and, thus, it was confirmed that a display panel having high light efficiency while effectively blocking foreign substances, such as oxygen and moisture, entering from the outside can be implemented. In addition, in the case of including the capping layer containing silicon oxynitride according to an embodiment, Si—ON peak (900 to 1200 $cm^{-1}$) according to FT-IR analysis was measured to have no change in value after 500 hours storage at high temperature and high humidity conditions (85° C./85%), and thus it was confirmed that a capping layer having robust capping properties can be formed even at high temperature and high humidity conditions.

Figure 11A:
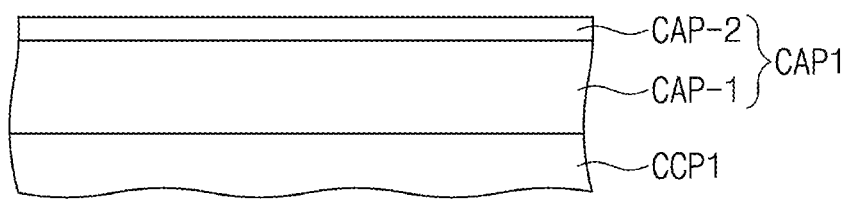
FIGS. 11A to 11C are cross-sectional views schematically illustrating a part of a display panel configuration according to some embodiments of the inventive concept.
Figure 11B:
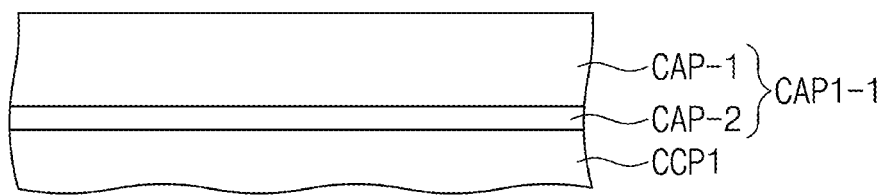
Figure 11C:
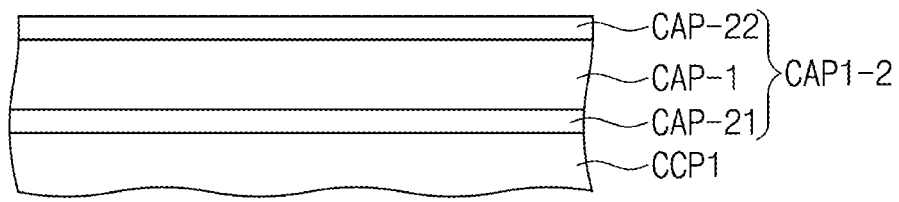
Figure 12:
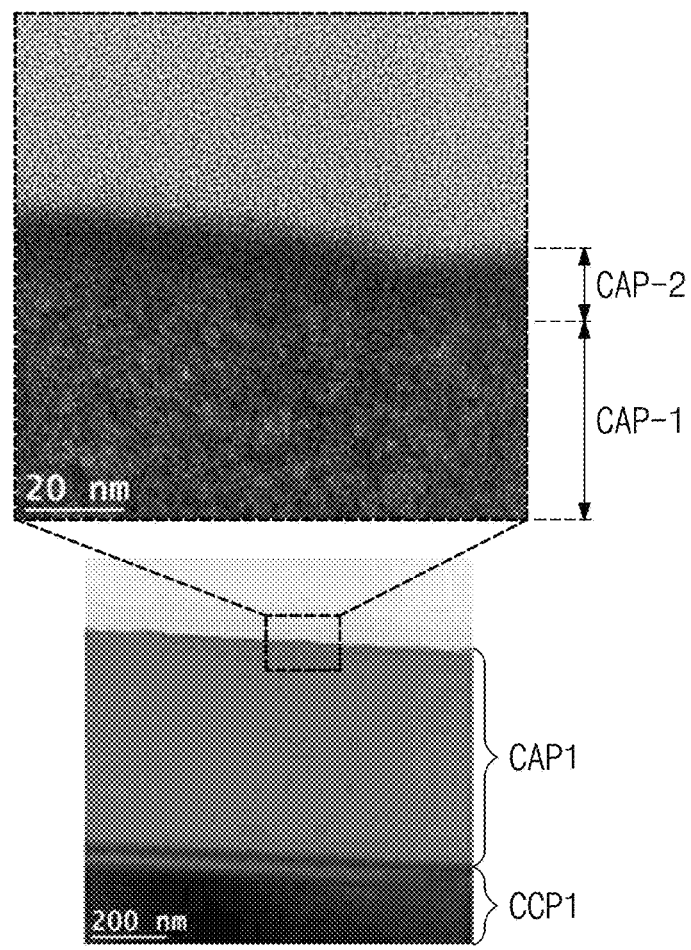
FIG. 12 is a micrograph of a part of a display panel configuration according to an embodiment of the inventive concept.

FIGS. 11A to 11C are cross-sectional views schematically illustrating a part of a display panel configuration according to an embodiment of the inventive concept; and FIG. 12 is a micrograph of a part of a display panel configuration according to an embodiment of the inventive concept. FIGS. 11A to 11C schematically illustrate the structure of a first capping layer disposed on a light control layer in a display panel configuration; and FIG. 12 is an enlarged photograph of a part of a first capping layer disposed on a light control layer in a display panel configuration.

Referring to FIGS. 11A to 11C and 12, in a display panel according to an embodiment, first capping layers CAP1, CAP1-1, and CAP1-2 may include a plurality of layers. The first capping layers CAP1, CAP1-1, and CAP1-2 may include a first layer CAP-1, which is a lower density layer, and a second layer CAP-2, which is a higher density layer. The second layer CAP-2 may be disposed above and/or below the first layer CAP-1. In an embodiment, the second layer CAP-2, as shown in FIG. 11A, may be disposed above the first layer CAP-1 to be spaced apart from the light control layer. In another embodiment, the second layer CAP-2, as shown in FIG. 11B, may be disposed below the first layer CAP-1 to contact the light control layer. In another embodiment, a plurality of second layers CAP-21 and CAP-22 may be provided and disposed both above and below the first layer CAP-1.

In an embodiment, the second layer CAP-2 may be formed by forming the first capping layers CAP1, CAP1-1, and CAP1-2 through silicon oxynitride, and then forming a high density film through plasma treatment. In an embodiment, the thickness of the second layer CAP-2 may be about 6 nm.

Figure 13A:
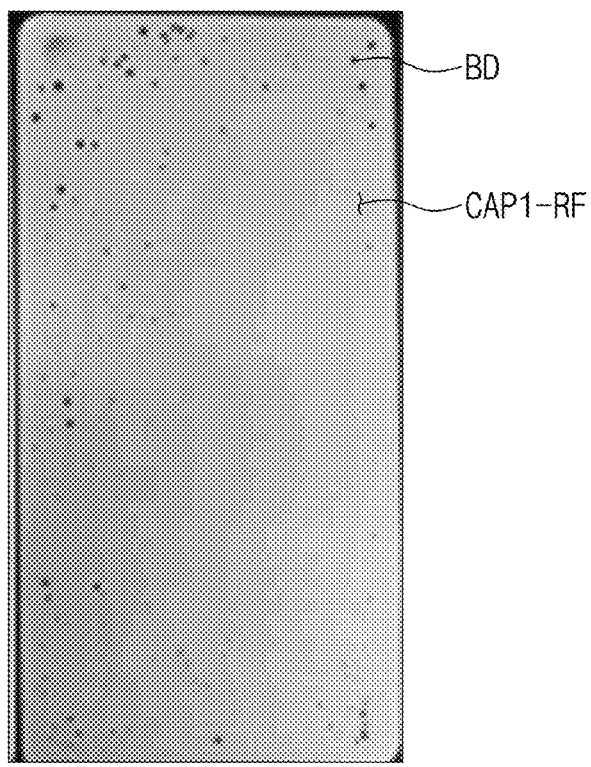
FIGS. 13A and 13B are photographs obtained by performing durability evaluation on display panels of some Examples and Comparative Examples.
Figure 13B:
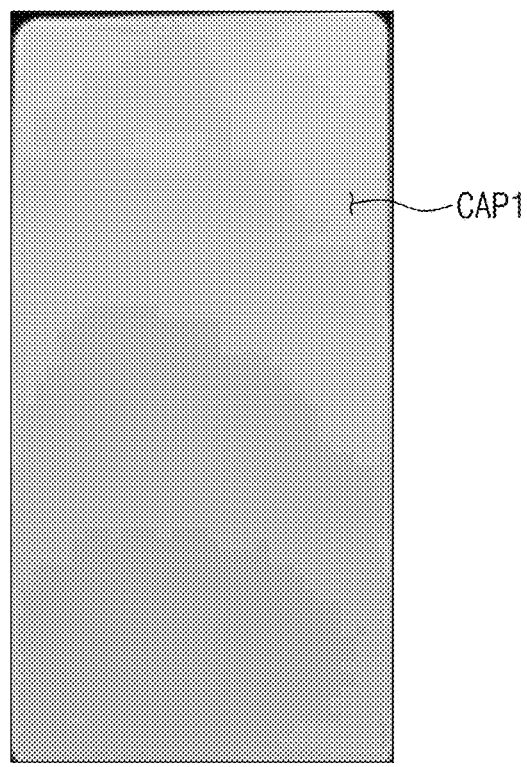

FIGS. 13A and 13B are photographs obtained by performing durability evaluation on display panels of the Examples and Comparative Examples. FIGS. 13A and 13B are photographs showing whether dark spots are generated after storage for 120 hours at high temperature and high humidity conditions (85° C./85% RH) on the first capping layer of the display panels of the Examples and Comparative Examples. FIG. 13A is a case of a Comparative Example in which a first capping layer CAP1-RF does not include a second layer that is a high density film; and FIG. 13B is a case of an Example in which a first capping layer CAP1 includes a second layer that is a high density film.

In the display panel according to an embodiment, as a first capping layer disposed on a light control layer includes a second layer, which is a high density film, display defects such as a dark spot BD may not occur even after long-term storage at high temperature and high humidity conditions. Accordingly, the display panel according to an embodiment may include a capping layer having a high density film on the light control layer to provide a display panel having high durability even at high temperature and high humidity conditions.

According to one or more embodiments of the inventive concept, a light control layer including a light emitter may be protected by a capping layer, and light emission efficiency may be maintained high.

According to one or more embodiments of the inventive concept, a display panel capable of protecting a light emitter included in a light control layer even at high temperature and high humidity conditions for a long time and preventing or substantially preventing luminous efficiency from being reduced due to a capping layer may be provided.

Although the inventive concept has been described with reference to some example embodiments of the inventive concept, it will be understood that the inventive concept is not limited to these embodiments, but various changes and modifications can be made by those skilled in the art without departing from the spirit and scope of the inventive concept. Accordingly, the technical scope of the inventive concept is not intended to be limited to the contents set forth in the detailed description of the specification, but is intended to be defined by the appended claims.

What is claimed is:

1. A display panel, comprising:
    a base substrate in which a pixel area and a peripheral area adjacent to the pixel area are defined;
    a light emitting element located on the base substrate to overlap the pixel area, and configured to generate first light;
    a light control layer on the light emitting element;
    a color filter layer on the light control layer; and
    a capping layer contacting at least the light control layer and comprising silicon oxynitride,
    wherein the capping layer contains about 34 at % to about 41 at % of oxygen, and about 18 at % to about 25 at % of nitrogen.

2. The display panel of claim 1, wherein the capping layer comprises a first capping layer between the light emitting element and the color filter layer.

3. The display panel of claim 2, wherein the capping layer further comprises a second capping layer between the light emitting element and the light control layer.

4. The display panel of claim 1, wherein the capping layer has a refractive index of about 1.6 to about 1.7.

5. The display panel of claim 1, wherein the capping layer comprises a first layer and a second layer having a greater density than the first layer.

6. The display panel of claim 1, wherein the light control layer comprises a first light conversion part to convert the first light into second light, a second light conversion part to convert the first light into third light, and a transmission part to transmit the first light.

7. The display panel of claim 6, wherein the color filter layer comprises:
    a first color filter overlapping the first light conversion part on a plane to transmit the second light,
    a second color filter overlapping the second light conversion part on a plane to transmit the third light, and
    a third color filter overlapping the transmission part on a plane to transmit the first light.

8. The display panel of claim 6, wherein a height of the transmission part is greater than heights of the first light conversion part and the second light conversion part.

9. The display panel of claim 6, wherein the light control layer further comprises partition walls respectively located between the first light conversion part, the second light conversion part, and the transmission part.

10. The display panel of claim 6, wherein the first light is light of a wavelength of about 410 nm to about 480 nm, the second light is light of a wavelength of about 500 nm to about 570 nm, and the third light is light of a wavelength of about 625 nm to about 675 nm.

11. The display panel of claim 1, wherein the light control layer comprises a plurality of quantum dots.

12. The display panel of claim 1, further comprising an encapsulation member on the light emitting element and comprising an inorganic layer at an outermost portion,
    wherein the light control layer contacts the inorganic layer.

13. The display panel of claim 1, further comprising an encapsulation member on the light emitting element, and a filling layer between the encapsulation member and the light control layer.

14. The display panel of claim 1, wherein the capping layer contacts an upper surface and a lower surface of the light control layer.

15. The display panel of claim 1, further comprising a pixel defining layer on the base substrate and comprising a plurality of openings corresponding to the pixel area defined therein, and
    the light emitting element is located in the plurality of openings.

16. A display panel, comprising:
a base substrate in which a pixel area and a peripheral area adjacent to the pixel area are defined;
a light emitting element located on the base substrate to overlap the pixel area;
a light control layer on the light emitting element;
a color filter layer on the light control layer; and
a first capping layer between the light control layer and the color filter layer, and comprising silicon oxynitride,
wherein the first capping layer has a refractive index of about 1.6 to about 1.7,
wherein the first capping layer comprises a first layer and a second layer having a greater density than the first layer, and
wherein the light control layer comprises a first light conversion part and a second light conversion part spaced apart from each other with the peripheral area therebetween.

17. The display panel of claim 16, further comprising a second capping layer between the light emitting element and the light control layer, and the second capping layer comprises silicon nitride.

18. The display panel of claim 16, wherein the first capping layer contacts an upper surface of the light control layer.

19. A display panel, comprising:
a base substrate in which a pixel area and a peripheral area adjacent to the pixel area are defined;
a light emitting element located on the base substrate to overlap the pixel area;
a light control layer on the light emitting element;
a color filter layer on the light control layer; and
a first capping layer between the light control layer and the color filter layer, and comprising silicon oxynitride,
wherein the first capping layer has a refractive index of about 1.6 to about 1.7, and
wherein the first capping layer comprises about 34 at % to about 41 at % of oxygen, and about 18 at % to about 25 at % of nitrogen.

20. A display panel, comprising:
a base substrate in which a pixel area and a peripheral area adjacent to the pixel area are defined;
a light emitting element located on the base substrate to overlap the pixel area;
a light control layer on the light emitting element;
a color filter layer on the light control layer; and
a first capping layer between the light control layer and the color filter layer, and comprising silicon oxynitride,
wherein the first capping layer has a refractive index of about 1.6 to about 1.7, and
wherein the first capping layer comprises a first layer and a second layer having a greater density than the first layer.

* * * * *